United States Patent [19]
Williams et al.

[11] Patent Number: 6,137,333
[45] Date of Patent: Oct. 24, 2000

[54] OPTIMAL DELAY CONTROLLER

[75] Inventors: Timothy J. Williams, Bellevue; Tsunglun Steve Yu, Issaquah, both of Wash.

[73] Assignee: Cypress Semiconductor Corp., San Jose, Calif.

[21] Appl. No.: 09/307,588

[22] Filed: May 7, 1999

[51] Int. Cl.$^7$ ...................................................... H03H 11/26

[52] U.S. Cl. ............................................. 327/261; 327/160

[58] Field of Search .................................. 327/2, 3, 5, 7, 327/8, 12, 16, 37, 40–44, 46–49, 160, 261, 263, 279, 286

[56] References Cited

U.S. PATENT DOCUMENTS

| | | | |
|---|---|---|---|
| 4,959,617 | 9/1990 | Martin | 327/12 |
| 5,229,843 | 7/1993 | Dorsman | 356/350 |
| 5,834,950 | 11/1998 | Co et al. | 327/3 |
| 5,926,041 | 7/1999 | Duffy et al. | 327/12 |

OTHER PUBLICATIONS

9601/DM9601 Retriggerable One Shot, National Semiconductor Corporation, Jun. 1989, pp. 1–6.

Obsolete Product Possible Substitute Product ICM7555, (CA555, CA555C, LM555C), Harris Semiconductor, Dec. 1999, File No. 834.6, pp. 1–6.

Timothy Williams et al., U.S.S.N. 09/231,211, Filed Jan. 14, 1999, Entitled "Self–Adjusted Optimal Delay Time Filter".

*Primary Examiner*—My-Trang Nuton
*Attorney, Agent, or Firm*—Christopher P. Maiorana, P.C.

[57] ABSTRACT

A first detection circuit, a second detection circuit and a counter circuit. The first detection circuit may be configured to present a first control signal in response to (i) an input signal having a period, (ii) an output signal and (iii) an enable signal. The second detection circuit may be configured to present a second control signal in response to (i) the input signal, (ii) the output signal and (iii) the enable signal. The counter circuit may be configured to present a delay signal in response to (i) the first control signal, (ii) the second control signal and (iii) the output signal. The delay signal may be a fraction of the period of the input signal.

18 Claims, 6 Drawing Sheets

OPTIMAL DELAY CONTROLLER

CROSS-REFERENCE TO RELATED APPLICATIONS

This application may relate to U.S. application Ser. No. 09/231,211, filed Jan. 14, 1999, which is hereby incorporated by reference in its entirety.

FIELD OF THE INVENTION

The present invention relates to a delay controller generally and, more particularly, to a delay controller that is close to, but does not exceed, one-half of the period of an input clock signal.

BACKGROUND OF THE INVENTION

Phase Lock Loop (PLL) circuits can generate specific frequencies. However, PLLs tend to be large, complex circuits that are not easily ported to various technologies. PLLs are normally designed for other functions than producing clock signals oscillating just under a half-cycle time, and as such are not optimized for this function.

SUMMARY OF THE INVENTION

The present invention concerns a first detection circuit, a second detection circuit and a counter circuit. The first detection circuit may be configured to present a first control signal in response to (i) an input signal having a period, (ii) an output signal and (iii) an enable signal. The second detection circuit may be configured to present a second control signal in response to (i) the input signal, (ii) the output signal and (iii) the enable signal. The counter circuit may be configured to present a delay signal in response to (i) the first control signal, (ii) the second control signal and (iii) the output signal. The delay signal may be a fraction of the period of the input signal.

The objects, features and advantages of the present invention include providing a delay circuit that may match a fraction of a period of an incoming signal that may (i) be implemented using a minimum of die area, (ii) operate independently of processing, temperature or voltage variations, (iii) be easily portable to a variety of technologies, (iv) be implemented with all-digital standard cells, and/or (v) dynamically adjust to variations in the period of the incoming signal.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
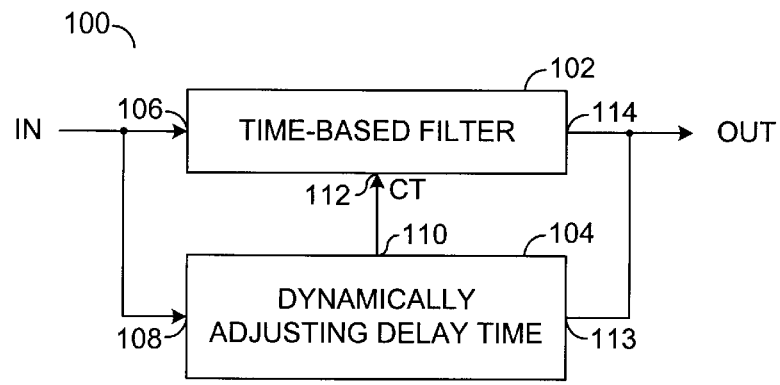
FIG. 1 illustrates a block diagram of the present invention implemented in a self-adjusted optimal delay time filter.

Referring to FIG. 1, a circuit 100 is shown implementing an example of the present invention. The circuit 100 generally comprises filter block (e.g., a time-based filter circuit) 102 and a delay block (e.g., a dynamically adjusting delay time block) 104 in accordance with a preferred embodiment of the present invention. The overall circuit 100 will be described as a context for the operation of the delay block 104 of the present invention. The circuit 102 may have an input 106 that may receive an input signal (e.g., IN). Similarly, the circuit 104 may have an input 108 that may also receive the input signal IN. The input signal IN may be a noisy and/or glitching input signal, such as a periodic signal, that may occur in a noisy circuit. The circuit 104 may have an output 110 that may present a control signal (e.g., CT) to an input 112 of the circuit 102. The delay circuit 104 may also have an input 113 that may receive a feedback of the signal OUT. The circuit 102 may have an output 114 that may present an output signal (e.g., OUT) in response to the input signal IN received at the input 106 and the control signal CT received at the input 112.

The time-based filter block 102 may track the clock edges of the input signal IN. When a rising or falling edge of the input signal IN is detected, the filter block may disable further changes for the amount of time, which may be determined by the delay circuit 104. The delay circuit 104 may adjust the delay to approach the half cycle time of the input signal IN and yet may ensure that the delay will not exceed the half clock cycle. The circuit 100 may, in one example, provide 100% protection against any noise injection by implementing a number of counter bits sufficient to generate a resolution just less than the half cycle time of the input signal IN. The proper width of the output signal OUT high and low times may be guaranteed by the dynamically adjusting delay circuit 104. Once the input signal IN transitions, additional output transitions do not generally occur until the delay time expires, regardless of how many times the input signal switches. The circuit 100 may also be immune from set-up and hold-time violations even with a randomly switching input signal IN. The output signal OUT will generally transition smoothly.

Figure 2:
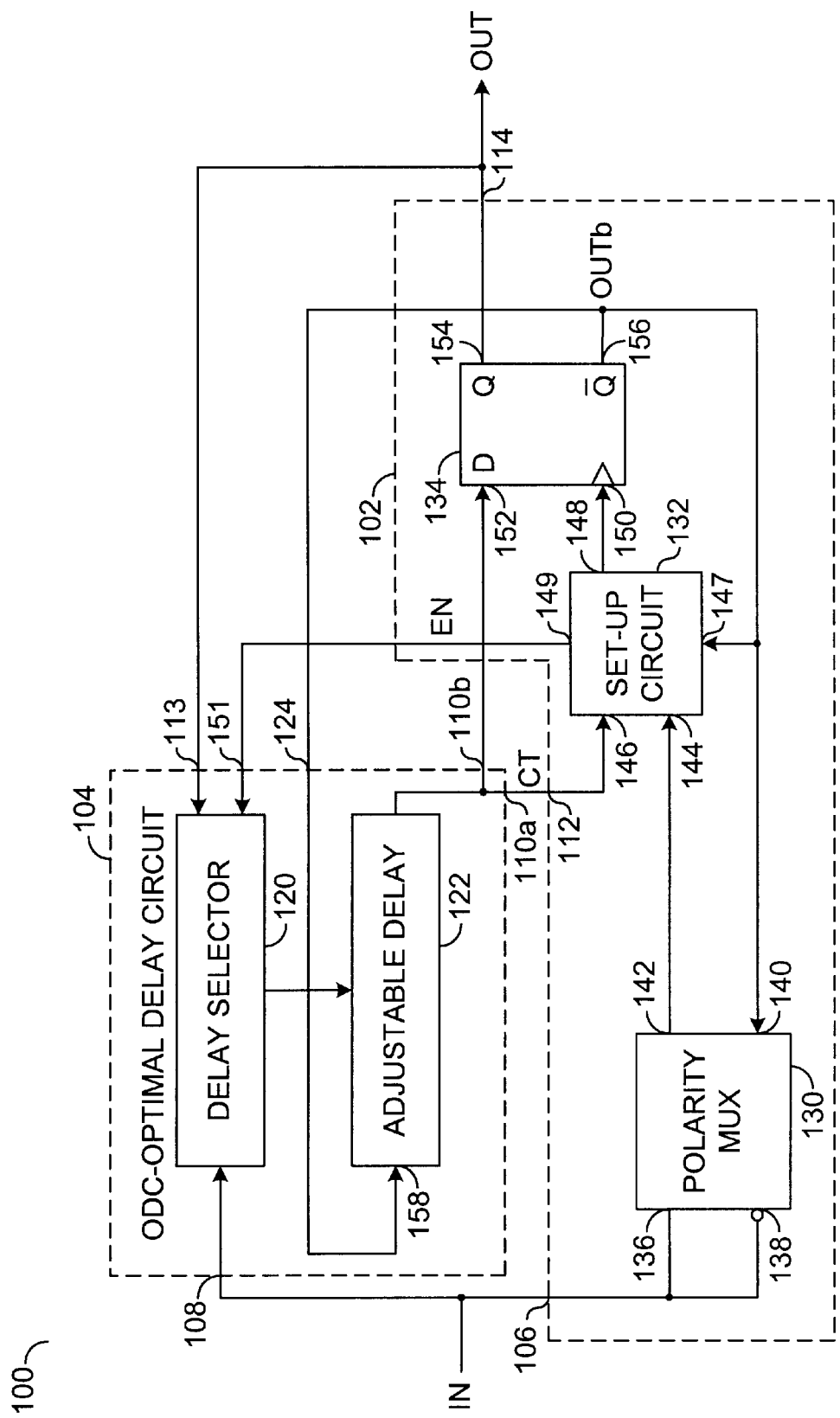
FIG. 2 illustrates a more detailed diagram of the circuit of FIG. 1.

Referring to FIG. 2, a more detailed diagram of the circuit 100 is shown. The delay circuit 104 is shown comprising a delay selector block (or circuit) 120 and an adjustable delay block (or circuit) 122. The delay circuit 104 also has an input 124 that generally receives a feedback of the signal OUT. The adjustable delay 122 generally presents the control signal CT at an output 110a and 110b. The delay time may be continuously adjusted so that a high or a low output time is equal to the average input high or low (i.e., the delay rejects glitches).

The circuit 102 generally comprises a polarity multiplexer 130, a set-up circuit 132 and a flip-flop 134. The polarity multiplexer 130 may have an input 136 that may receive the input signal IN, an input 138 that may receive a digital complement of the input signal IN (e.g., INb), a select input 140 that may receive a select signal (e.g., a signal OUTb, which is generally a digital complement of the signal OUT) from the flip-flop 134 and an output 142 that may present a signal to an input 144 of the set-up circuit 132. The set-up circuit 132 may also have an input 146 that may receive the control signal CT, an input 147 that may receive a feedback of the signal OUTb, an output 148 that may present a signal to a clock input 150 of the flip-flop 134 and an output 149 that may present an enable signal (e.g., EN) to an input 151 of the delay circuit 104. The flip-flop 134 may also have an input 152 that may receive a control signal CT, an output 154 that may present the signal OUT and an output 156 that may present a digital complement of the signal OUT. The signal OUTb presented at the output 156 may be presented to the input 140 of the polarity multiplexer 130, the input 147 of the set-up circuit 132, and to an input 158 of the adjustable delay 122.

The delay circuit 104 may continuously track the input clock signal IN and may extend the time-filter delay to be close to, but less than, the clock pulse width (e.g., high or low) of the input clock signal IN.

By preventing transitions during the delay time, the filter circuit 102 may reject EMC and Electrical Fast Transient (EFT) noise. The delay circuit 104 may eliminate the dependency of the delay elements to process variations, temperature fluctuations, and voltage changes, by continuously tracking and compensating for these effects. The circuit 100 may be implemented using simple standard cells that may be ported to various technologies without significant redesign. The circuit 100 generally consumes less area than a conventional PLL and yet may provide a similar or better degree of noise rejection. During the delay window, the circuit 100 may act like an infinitely strong frequency domain filter.

The flip-flop 134 may be implemented, in one example, as a D-type flip-flop that has a delayed data input 152. However, a T-type flip-flop may be implemented to meet certain design constraints. After the delay presented by the delay circuit 104, the data input 152 is generally an inverted version of the output signal OUT. Under normal operation, the flip-flop 134 may simply change state with every clock edge (e.g., operates like a divide-by-2). The filtering action may take place due to the delay circuit 104. Following a transition of the signal OUT, if multiple clocks are received while the data input is unchanged (because the inverted signal has not yet passed through the delay), the output 154 will not toggle. Once the signal passes through the delay circuit 104, the flip-flop will toggle on the next clock edge.

Because the flip-flop 134 is generally clocked with a given edge (such as a rising edge), the input clock 150 is generally "doubled" so that a rising edge occurs whenever the input clock transitions (rising or falling edge). An example of such an implementation may be with the multiplexer 130 that may pick either the input signal IN or an inverted-input signal INb, based on the output of the flip-flop 134. This makes the clock input 150 to the flip-flop 134 pulse on each edge of the input signal IN. In another implementation, which is similar to a multiplexer, an XOR gate may be implemented having an input that receives the clock input IN and an input that receives the flip-flop output OUT.

The set-up circuit 132 may prevent a timing hazard at the clock input 150 of the flip-flop 134. The circuit 132 may ensure that the set-up time for the flip-flop 134 is met by preventing any transitions at the flip-flop clock input 150 until the data input 152 has settled. The set-up circuit 132 generally forces one or more gate delays between the data input 152 and the clock input 150 of the flip-flop 134.

In general, once a clock edge occurs, the output 156 of flip-flop 134 transitions, which sends an inverted signal through the delay line. Within a short delay of the flip-flop change, the clock input 150 to the flip-flop 134 is disabled until the data input 152 has settled. If multiple transitions occur rapidly at the clock input 150 (possibly because of noise), the flip-flop 134 does not generally toggle sooner than the delay-line time. As a result, output 154 of the flip-flop 134 is generally filtered from noise that may be received from the input signal IN during the delay time.

The adjustable delay 122 may dynamically adjust to maximize the delay time, while still keeping the delay time just under the high (or low) period of the clock, to maximize the filter effectiveness. This generally keeps the internal clock "clean," thus preventing unwanted clock pulses that would otherwise occur too fast for internal circuitry to keep up with. In one example, the adjustable delay 122 may be implemented with digital gates or more elaborate analog delays.

Figure 3:
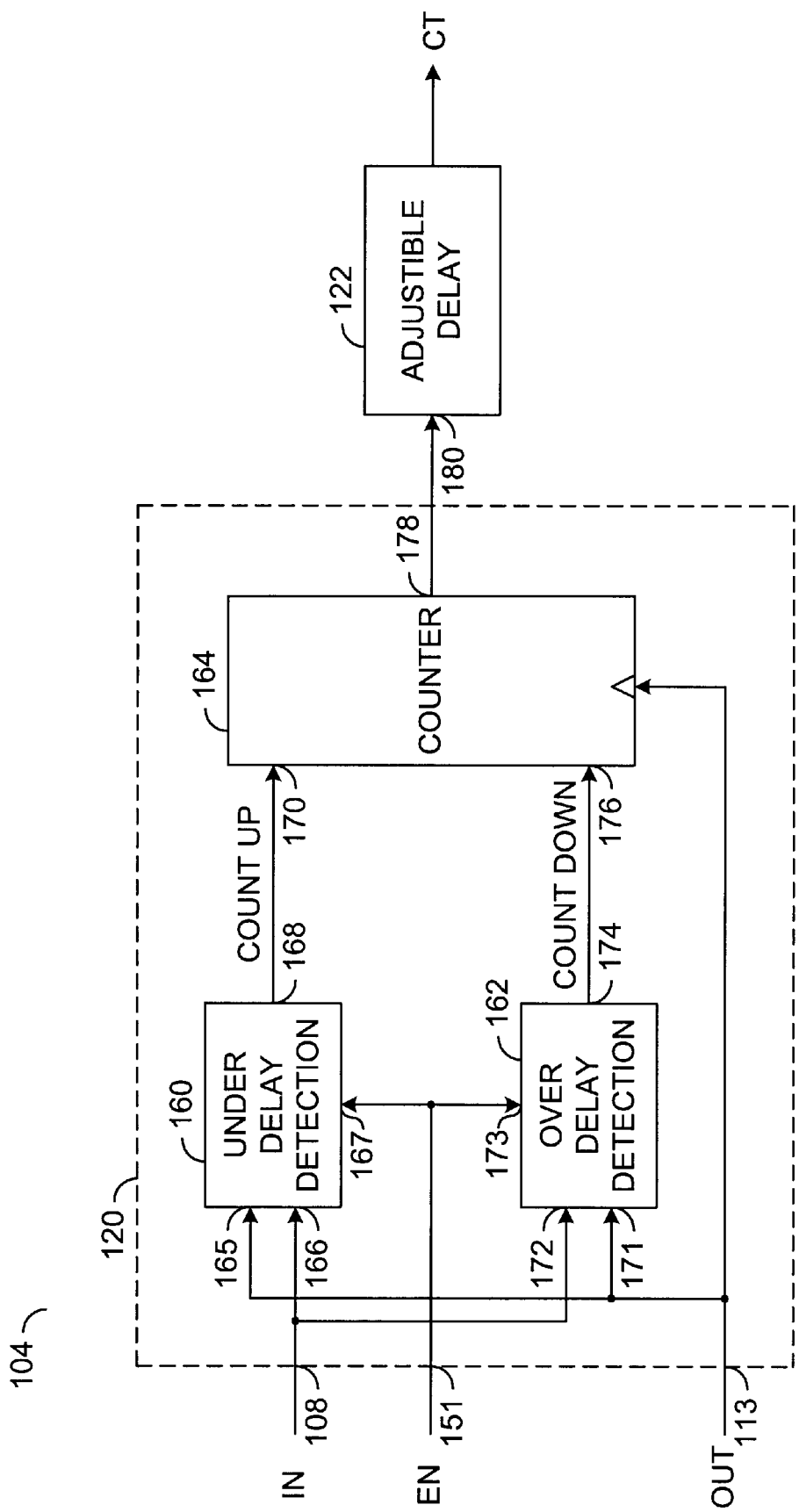
FIG. 3 illustrates a more detailed diagram of the delay circuit.

Referring to FIG. 3, an example of the delay circuit 104 is shown. The delay selector 120 is shown comprising an under delay detection circuit 160, an over delay detection circuit 162 and a counter 164. The under delay detection circuit 160 may have an input 165 that may receive the signal OUT, an input 166 that may receive the signal IN, an input 167 that may receive the signal EN and an output 168 that may present a signal (e.g., Count Up) to an input 170 of the counter 164. The over delay detection circuit 162 may have an input 171 that may receive the signal OUT, an input 172 that may receive the signal IN, an input 173 that may receive the signal EN and an output 174 that may present a signal (e.g., Count Down) to an input 176 of the counter 164. The counter 164 may have an output 178 that may present a signal to an input 180 of the adjustable delay 122.

The delay detectors 160 and 162 generally determine if the adjustable delay 122 should be changed to a more optimal setting in response to (i) the input signal IN, (ii) the output signal OUT and (iii) the enable signal EN. The signal Count Up generally causes the counter 164 to count up when asserted at the rising edge of the signal OUT, which generally increases the adjustable delay time. The signal Count Down generally causes the counter 164 to count down when asserted at the rising edge of the signal OUT, which generally decreases the adjustable delay time. The circuit 104 illustrates one example of an adjustable delay circuit. Other circuits may be implemented accordingly to meet the design criteria of a particular implementation.

Figure 4:
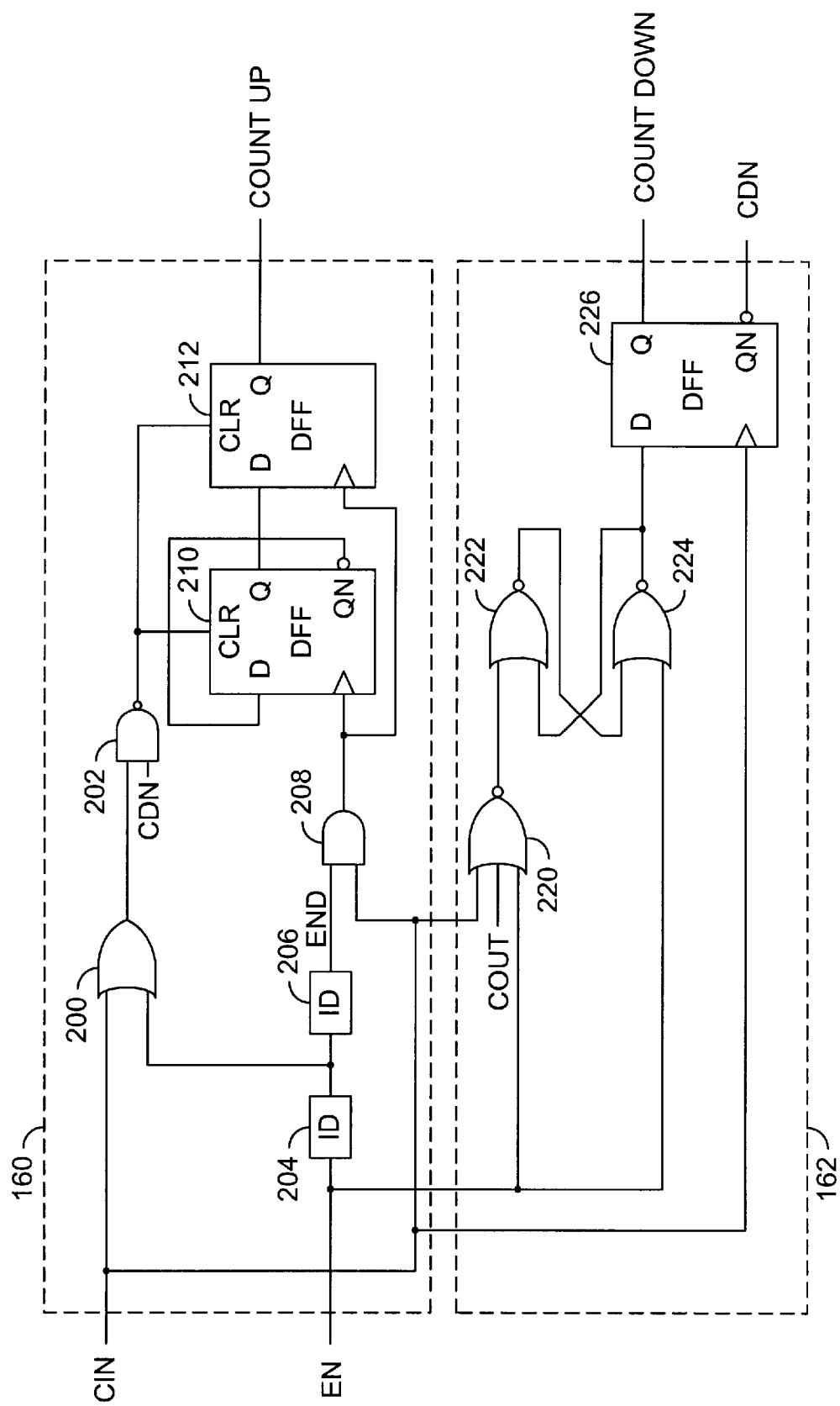
FIG. 4 illustrates a circuit diagram of an over/under delay detection and adjustment circuit.

Referring to FIG. 4, a more detailed diagram of the under delay detection circuit 160 and the over delay detection circuit 162 is shown. The under delay detection circuit generally comprises a gate 200, a gate 202, a delay 204, a delay 206, a gate 208, a memory element 210 and a memory element 212. In one example, the memory element 210 and the memory element 212 may be implemented as D-type flip-flops. However, other memory elements, such as T-type flip-flops may be implemented accordingly to meet the design criteria of a particular implementation. Additionally, the gate 200 is shown as an OR gate, the gate 202 is shown as a NAND gate and the gate 208 is shown as a AND gate. However, the gates 200, 202 and 208 may be implemented with other gates accordingly to meet the design criteria of a particular implementation. The over delay detection circuit 162 generally comprises a gate 220, a gate 222, a gate 224 and a memory element 226. In one example, the memory element 226 may be implemented as a D-type flip-flop. However, other types of memory elements, such as a T-type flip-flop may be implemented accordingly to meet the design criteria of a particular implementation. The gates 220, 222 and 224 are shown as NOR gates. However, other types of gates may be substituted accordingly to meet the design criteria of a particular implementation.

Figure 5:
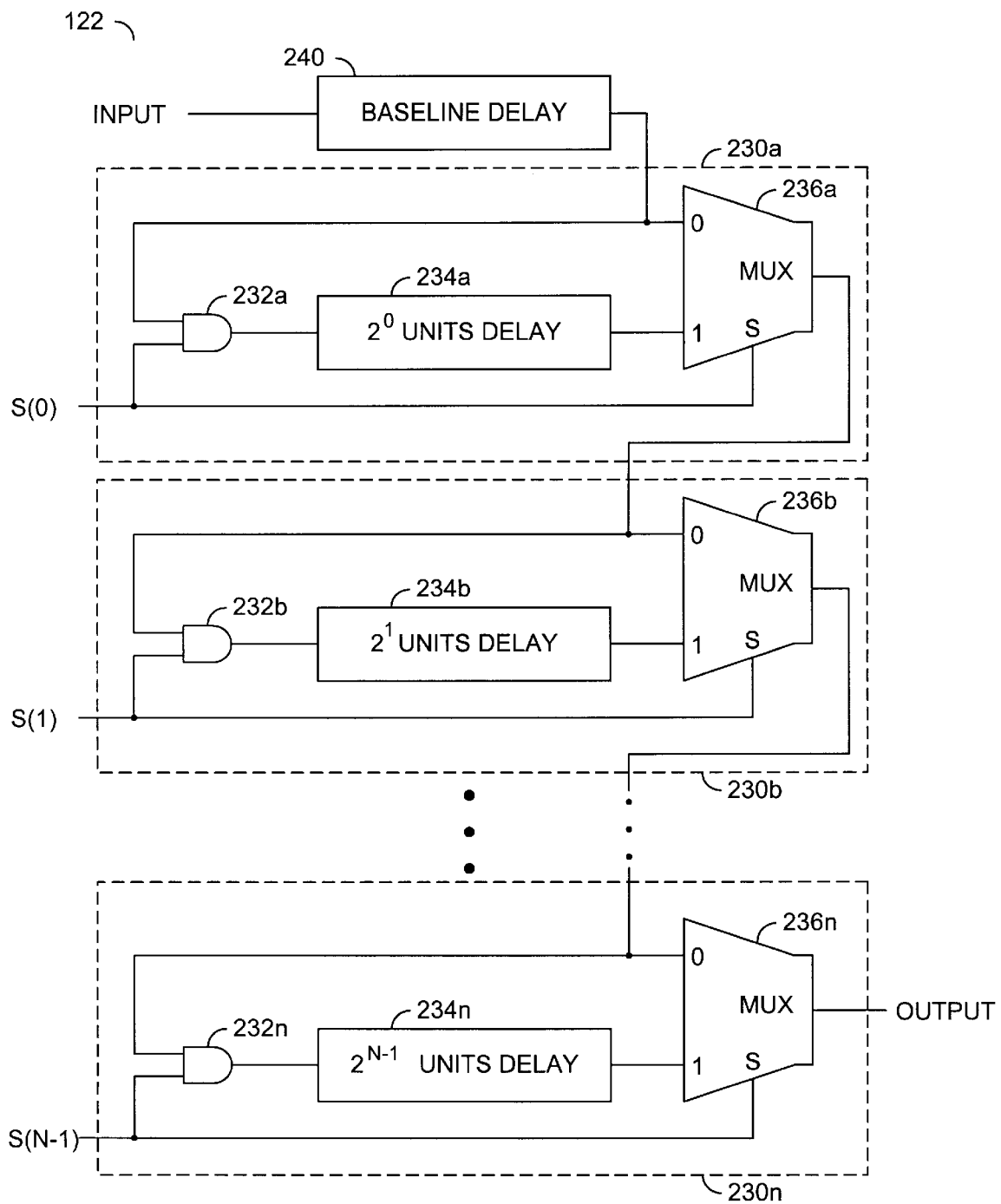
FIG. 5 is a circuit diagram of an adjustable delay cell with a flush out circuit.

Referring to FIG. 5, a more detailed diagram of the adjustable delay circuit 122 including a filter (e.g., delay flush out mechanism) is shown. The adjustable delay circuit 122 generally comprises a number of delay cells 230a–230n. The delay element 230a is shown comprising a gate 232a, a delay block 234a and a multiplexer 236a. The delay blocks 230b and 230n have similar components. The gates 232a–232n generally form the delay flush out mechanism. A first input of the multiplexer 236a generally receives a signal from a base line delay block 240. The multiplexer 236b of the delay element 230b generally receives a signal from the output of the multiplexer 236a. Each of the delay elements 230b–230n generally receives the output from the previous delay element. The multiplexers select the number of delay elements to be included in the delay path. The delay flush out mechanism may eliminate the potential glitches that may occur when adjusting from a shorter delay path to a longer ones.

The adjustable delay circuit 122 may generate the signal CT in response to a delay provided by the baseline delay 240 and the delay elements 234a–234n. In one example, the baseline delay 240 may present a 40 ns delay. In another example the baseline delay 240 may present a delay between 0–100 ns, more preferably between 20–60 ns, most preferably between 30–50 ns. The selectable delay cells 234a–234n may present a delay of 5 ns*$2^N$, or 5 ns, 10 ns, 20 ns, and 40 ns when four delay cells are implemented. In such an example, the total delay may be equal to 40 ns+5 ns*S[3:n], where S[3:n] are the delay calibration signals. Such a configuration may provide 40 ns to 115 ns of delay. The configuration of the delay cells 234a–234n is generally self-decoded and arranged as 5 ns*$2^0$, $2^1$, $2^2$, $2^n$, respectively. This type of arrangement matches the binary format control signals S[3:0] and the total delay may be obtained from adding up the delays selected by the control signals. Such a configuration may save logic gates since a decoder may not be needed for the control signals.

The delay-flush-out AND gates 232a–232n may be used to prevent glitches that may occur when more than one calibration bit changes states on a particular transition (e.g., from 0111b to 1000b, from 0011b to 0100b, etc. for the case of 4 select bits S[3:0]). The delay-flush-out AND gates may flush out the unselected paths presented to the "1" input of the multiplexers 236a–236n. The gates 232a–232n may ensure that the adjustable delay cells 234a–234n do not glitch during the delay count-up operation.

The over delay detection circuit 162 may determine when the synthesized delay is larger than the input delay (e.g., the half-clock cycle) that is being matched. The under delay detection circuit 160 may cause a delay increase until the optimal value is reached. The adjustable delay circuit 122 may contain selectable delay cells to produce the target delay, and may include a delay flush out mechanism that may provide a clean switching of the delays.

Figure 6A:
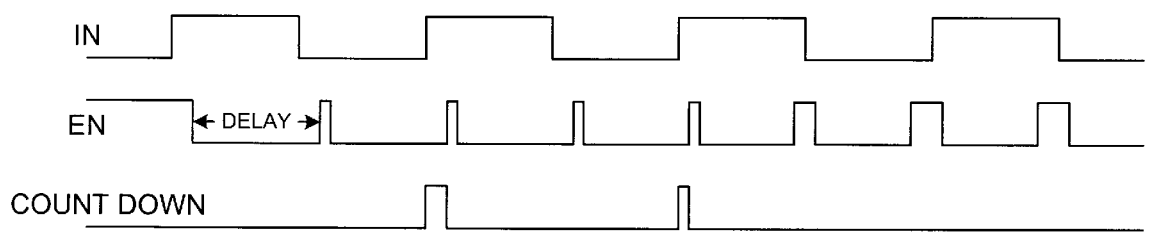
FIGS. 6A–6C illustrate various waveforms of the circuits of FIGS. 4 and 5.

The over delay detection circuit 162 may function by comparing the rising edge of the clock signal IN with the enable signal EN to determine if there is an over-delay condition. Referring to FIG. 6a, if the rising edge of the clock signal IN occurs sooner than the enable signal EN, then the signal COUNT DOWN may be set to reduce the counter count and reduce the delay.

Figure 6B:
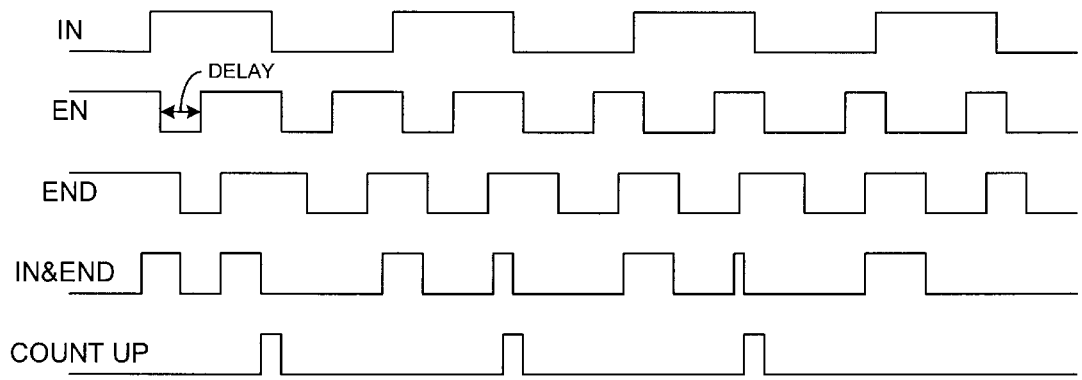

Referring to FIG. 6b, the under delay detection circuit 160 may set the signal COUNT UP to increase the counter counts when two consecutive delayed enable signals END overlap the clock input signal. The amount of the delay between the signal IN and the signal END is generally twice the amount of delay increment in the circuit 122 that may ensure the stability of the circuit 100.

Figure 6C:
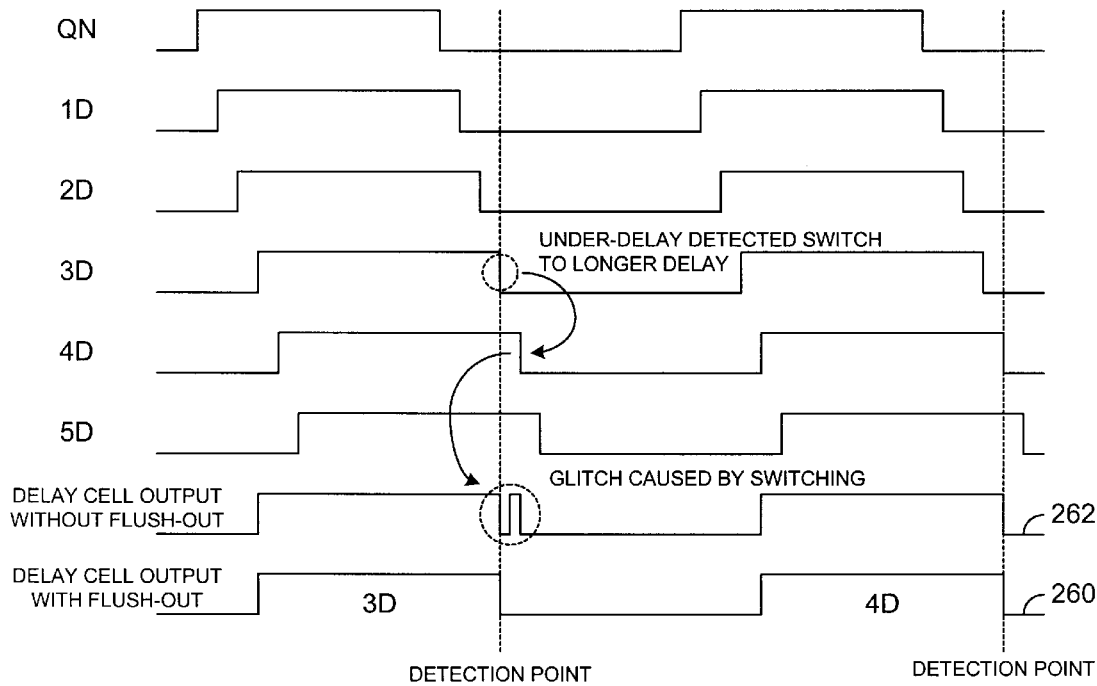

Referring to FIG. 6c, an example of the circuit 104 is shown with the flush-out gate 232a–232n (e.g., the waveform 260) and without the flush-out gates (e.g., waveform 262).

The circuit 104 may be a small and efficient way to generate a delay than closely matches a fraction of a period of an incoming signal IN. While the circuit 120 has been described in connection with generating a delay that matches half of the period of the incoming signal IN, other fractions of the incoming period may be generated accordingly to meet the design criteria of a particular implementation. The circuit may be implemented using less die area 104 than PLL-like implementations. The circuit 104 may provide operation that is independent of silicon processing, operating temperature and voltage variations. The circuit 104 may be very portable (e.g., it may be implemented with all-digital standard cells) to other technologies and may be implemented without sensitive analog circuits or techniques.

The elements illustrated in FIGS. 4 and 5 are examples of a particular implementation of the present invention. Alternatives, such as logic equivalence circuits, may be implemented accordingly to meet the design criteria of a particular implementation. For example, the flip-flops 210, 212 and 226 used in the over delay detection circuit 162 and the under delay detection circuit 160 may be driven by a filtered output clock. The delay-flush-out mechanism is shown implemented as the multiplexers 236a–236n. However, other equivalent logic may be used. The delay elements 234a–234n and the delay element 240 may be implemented in a variety of ways, including slow digital cells or more complex analog delay cells.

The present invention may be useful in circuits such as the Self-Adjusting Optimal Delay Time Filter, U.S. application Ser. No. 09/231,211, referred previously which may be used for reducing sensitivity to Electrical Fast Transient Burst (EFTB) sensitivity.

While the invention has been particularly shown and described with reference to the preferred embodiments thereof, it will be understood by those skilled in the art that various changes in form and details may be made without departing from the spirit and scope of the invention.

What is claimed is:

1. A circuit comprising:
    a first detection circuit configured to present a first control signal in response to (i) an input signal having a period, (ii) an output signal and (iii) an enable signal;
    a second detection circuit configured to present a second control signal in response to (i) said input signal, (ii) said output signal and (iii) said enable signal; and
    a counter circuit configured to present a delay signal in response to (i) said first control signal, (ii) said second control signal and (iii) said output signal, wherein said delay signal is a fraction of the period of the input signal.

2. The circuit according to claim 1, wherein said delay signal is not greater than one-half the period of the input signal.

3. The circuit according to claim 1, wherein said delay signal dynamically adjusts said control signal in response to the period of said input signal.

4. The circuit according to claim 1, wherein said first control signal comprises a count up signal.

5. The circuit according to claim 4, wherein said first detection circuit increases a magnitude of said count up signal in response to said delay being less than said fraction of said period of said input signal.

6. The circuit according to claim 1, wherein said second control signal comprises a count down signal.

7. The circuit according to claim 6, wherein said second detection circuit decreases a magnitude of said count down signal in response to said delay being greater than said fraction of said period of said input signal.

8. The circuit according to claim 1, further comprising an adjustable delay circuit configured to control said delay.

9. The circuit according to claim 8, wherein adjustable delay circuit comprises:
- a first delay circuit configured to generate a first portion of said delay; and
- one or more second delay circuits each configured to generate a second portion of said delay.

10. The circuit according to claim 9, wherein said one or more second delay circuits each include a filter circuit configured to prevent glitches on said delay.

11. A circuit comprising:
- means for generating a first control signal in response to (i) an input signal having a period, (ii) an output signal and (iii) an enable signal;
- means for generating a second control signal in response to (i) said input signal, (ii) said output signal and (iii) said enable signal; and
- means for generating a delay signal in response to (i) said first control signal, (ii) said second control signal and (iii) said output signal, wherein said delay signal is a fraction of the period of the input signal.

12. A method for generating a delay comprising the steps of:
- (A) generating a first control signal in response to (i) an input signal having a period, (ii) an output signal and (iii) an enable signal;
- (B) generating a second control signal in response to (i) said input signal, (ii) said output signal and (iii) said enable signal; and
- (C) generating a delay signal in response to (i) said first control signal, (ii) said second control signal and (iii) said output signal, wherein said delay signal is a fraction of the period of the input signal.

13. The method according to claim 12, wherein said delay signal is not greater than one-half the period of the input signal.

14. The method according to claim 12, wherein said method dynamically adjusts said control signal in response to the period of said input signal.

15. The method according to claim 12, wherein step (A) increases a magnitude of said first control signal in response to said delay being less than said fraction of said period.

16. The method according to claim 12, wherein step (B) decreases a magnitude of said second control signal in response to said delay being greater than said fraction of said period.

17. The method according to claim 12, wherein step (C) comprises the sub-steps of:
- (C-1) generating a fixed portion of said delay; and
- (C-2) generating one or more variable portions of said delay.

18. The method according to claim 17, wherein sub-step (C-2) comprises filtering said variable portions to prevent glitches on said delay.

* * * * *